United States Patent
Sakamoto (10) Patent No.: US 11,062,916 B2
(45) Date of Patent: Jul. 13, 2021

(54) METHOD FOR MANUFACTURING SEMICONDUCTOR DEVICE

(71) Applicant: Mitsubishi Electric Corporation, Tokyo (JP)

(72) Inventor: Ken Sakamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/500,856

(22) PCT Filed: Aug. 23, 2017

(86) PCT No.: PCT/JP2017/030127
§ 371 (c)(1),
(2) Date: Oct. 4, 2019

(87) PCT Pub. No.: WO2019/038857
PCT Pub. Date: Feb. 28, 2019

(65) Prior Publication Data
US 2020/0176273 A1    Jun. 4, 2020

(51) Int. Cl.
*H01L 21/48* (2006.01)
*H01L 21/56* (2006.01)

(52) U.S. Cl.
CPC ...... *H01L 21/4882* (2013.01); *H01L 21/4853* (2013.01); *H01L 21/565* (2013.01)

(58) Field of Classification Search
CPC . H01L 21/4882; H01L 21/565; H01L 23/433; H01L 23/4334; H01L 23/4338
See application file for complete search history.

(56) References Cited

U.S. PATENT DOCUMENTS

| 5,874,324 A * | 2/1999 | Osada | B29C 43/12 438/124 |
| 6,058,602 A * | 5/2000 | Fehr | H01L 21/565 174/528 |
| 6,262,480 B1 * | 7/2001 | Ferri | B29C 45/14655 257/675 |

(Continued)

FOREIGN PATENT DOCUMENTS

| JP | H07130782 A | 5/1995 |
| JP | H10064933 A | 3/1998 |
| WO | 2015/173862 A1 | 11/2015 |

OTHER PUBLICATIONS

International Search Report; Written Opinion; and Notification of Transmittal of the International Search Report and the Written Opinion of the International Searching Authority, or the Declaration issued in PCT/JP2017/030127; dated Nov. 21, 2017.

*Primary Examiner* — Tuan A Hoang
(74) *Attorney, Agent, or Firm* — Studebaker & Brackett PC (57) ABSTRACT

A heat sink (4) having a step in a bottom surface corner and a rectangular planar shape is disposed in an interior of a cavity (5) of a metal mold (1) and a first pin (2) is caused to project from a bottom surface of the cavity (5) to position the heat sink (4). A second pin (3) projecting from the bottom surface of the cavity (5) is disposed at the step of the positioned heat sink (4). After the heat sink (4) is positioned, the first pin (2) is lowered to the bottom surface of the cavity (5) and the heat sink (4) is sealed with the mold resin (10) with the second pin (3) being left projecting.

14 Claims, 6 Drawing Sheets

(56) References Cited

U.S. PATENT DOCUMENTS

| | | | |
|---|---|---|---|
| 6,821,822 B1* | 11/2004 | Sato | H01L 21/565 |
| | | | 438/127 |
| 2016/0343644 A1 | 11/2016 | Kawashima et al. | |
| 2017/0330809 A1* | 11/2017 | Kajihara | H01L 23/3107 |

* cited by examiner

METHOD FOR MANUFACTURING SEMICONDUCTOR DEVICE

FIELD

The present invention relates to a method for manufacturing a semiconductor device sealing a heat sink with mold resin.

BACKGROUND

For power semiconductor modules, heat sinks provided with a step in bottom surface corners are used for the purpose of improving strength of adhesion with resin and preventing infiltration of water content from outside air. In a transfer mold process of a power semiconductor module, a heat sink needs to be placed at a fixed position on a lower metal mold. Examples of this positioning method include positioning using fixing pins and positioning using movable pins (e.g., see Patent Literature 1).

CITATION LIST

Patent Literature

[PTL 1]
  JP H10-064933 A

SUMMARY

Technical Problem

In positioning using fixing pins, no positional displacement caused by a mold resin flow is generated in the heat sink. However, U-figured or circular holes need to be provided in the heat sink so that the fixing pins are fitted therein. The fixing pins also play the role of forming screw holes for tightening after molding. However, positioning using the fixing pins has not been applicable to heat sinks having a rectangular planar shape.

On the other hand, in positioning using movable pins, a rectangular heat sink can be positioned by surrounding a periphery of the heat sink with the movable pins. In order to prevent any positional displacement caused by a flow of mold resin, resin is injected with the movable pins being left projecting and the distal ends of the pins are lowered to the bottom surface of a cavity after the injection is completed. However, when the movable pins are lowered, resin burr may enter the periphery of the movable pins, resulting in an increase in the sliding resistance, and so a maximum value of the movable range is on the order of 0.5 mm. For this reason, the movable pins cannot project up to a sufficient height with respect to a thick heat sink with a step. Therefore, positioning using the movable pins has not been applicable to heat sinks with a step.

The present invention has been implemented to solve the above-described problem, and it is an object of the present invention to provide a method for manufacturing a semiconductor device capable of positioning a heat sink having a rectangular planar shape with a step in bottom surface corners and sealing it with mold resin.

Solution to Problem

A method for manufacturing a semiconductor device according to the present invention includes: disposing a heat sink having a step in a bottom surface corner and a rectangular planar shape in an interior of a cavity of a metal mold and causing a first pin to project from a bottom surface of the cavity to position the heat sink; disposing a second pin projecting from the bottom surface of the cavity at the step of the positioned heat sink; and after the heat sink is positioned, lowering the first pin to the bottom surface of the cavity and sealing the heat sink with the mold resin with the second pin being left projecting.

Advantageous Effects of Invention

In the present invention, after causing a first pin to project to position the heat sink, the first pin is lowered and the heat sink is sealed with the mold resin with the second pin being left projecting. This makes it possible to position the heat sink with a step in bottom surface corner and having a rectangular planar shape and seal it with the mold resin.

DESCRIPTION OF EMBODIMENTS

A method for manufacturing a semiconductor device according to the embodiments of the present invention will be described with reference to the drawings. The same components will be denoted by the same symbols, and the repeated description thereof may be omitted.

First Embodiment

Figure 1:
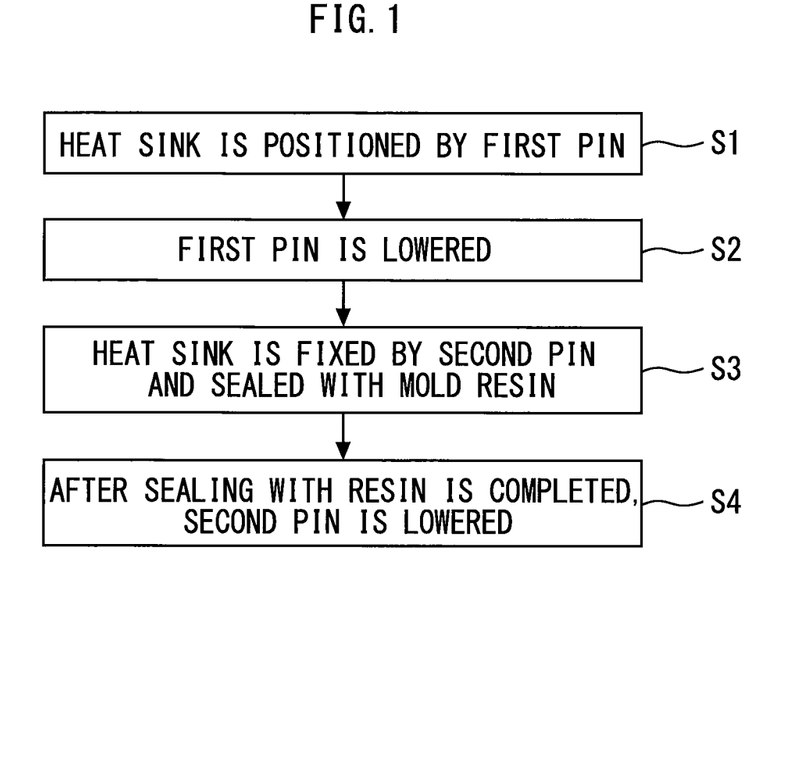
FIG. 1 is a flowchart of a method for manufacturing a semiconductor device according to a first embodiment of the present invention.
Figure 2:
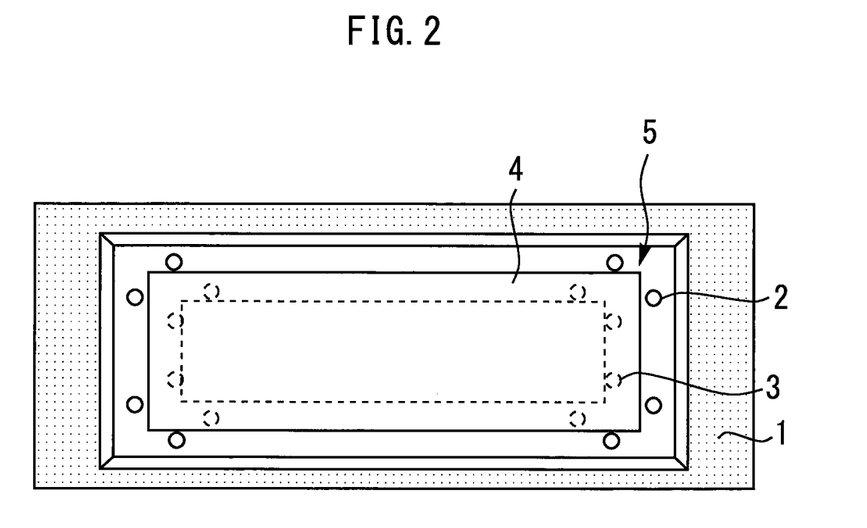
FIG. 2 is a plan view illustrating the method for manufacturing a semiconductor device according to the first embodiment of the present invention.
Figure 3:
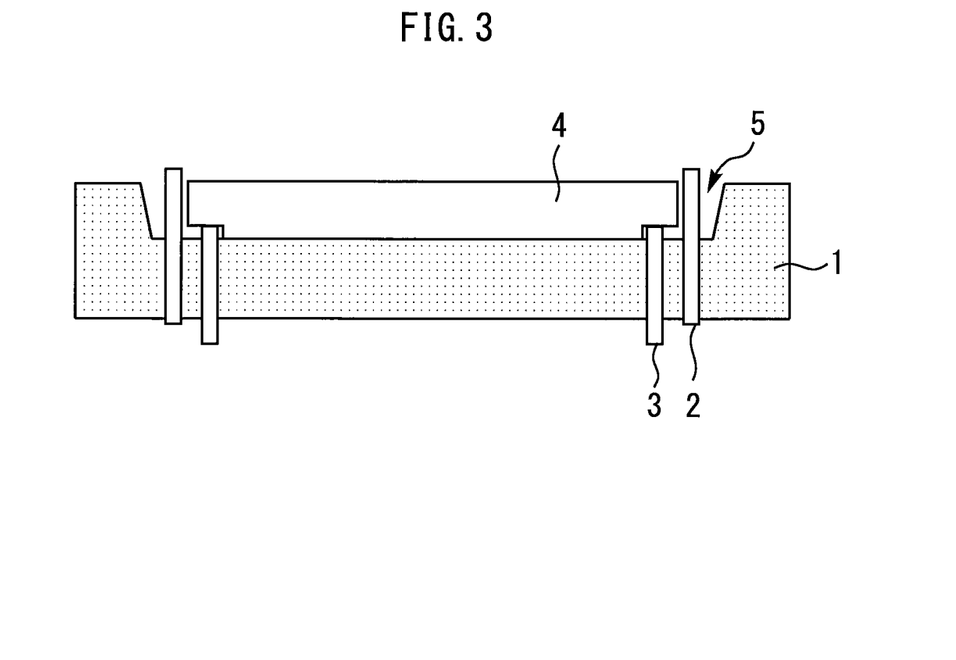
FIG. 3 is a cross-sectional view illustrating the method for manufacturing a semiconductor device according to the first embodiment of the present invention.
Figure 4:
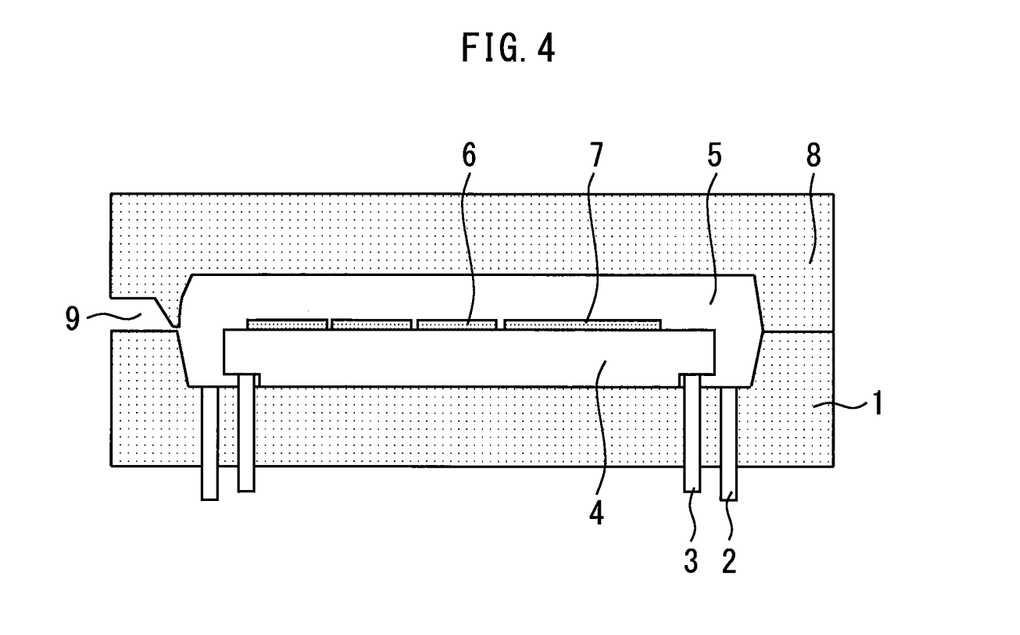
FIG. 4 is a cross-sectional view illustrating the method for manufacturing a semiconductor device according to the first embodiment of the present invention.
Figure 5:
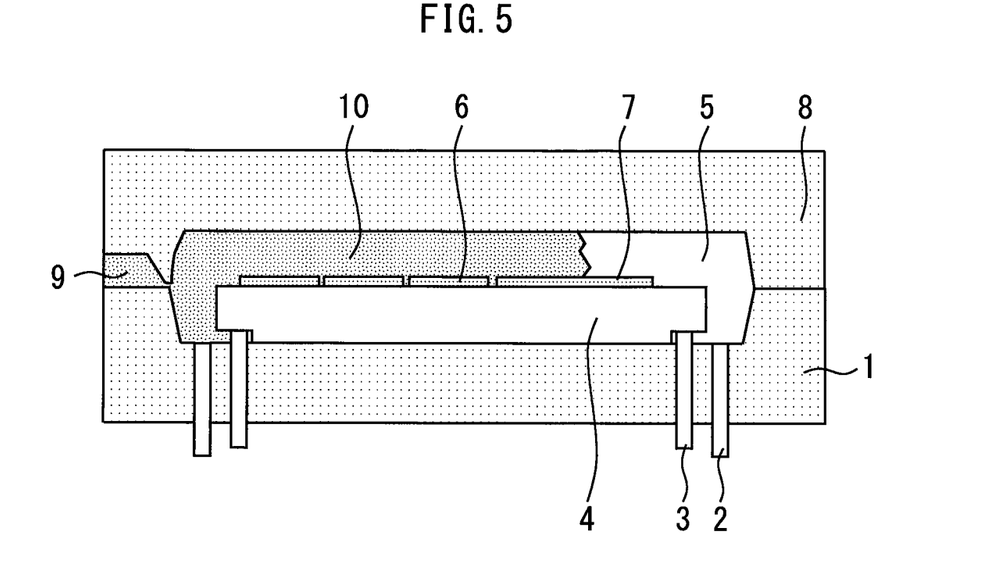
FIG. 5 is a cross-sectional view illustrating the method for manufacturing a semiconductor device according to the first embodiment of the present invention.

FIG. 1 is a flowchart of a method for manufacturing a semiconductor device according to a first embodiment of the present invention. FIG. 2 is a plan view illustrating the method for manufacturing a semiconductor device according to the first embodiment of the present invention. FIG. 3 to FIG. 5 are cross-sectional views illustrating the method for manufacturing a semiconductor device according to the first embodiment of the present invention.

As shown in FIG. 2 and FIG. 3, first pins 2 and second pins 3 which are movable pins are provided on a lower metal mold 1. A metallic heat sink 4 is disposed in the interior of a cavity 5 of the metal mold 1 and the first pins 2 are caused to project from a bottom surface of the cavity 5 to position the heat sink 4 (step S1). The heat sink 4 has a step in bottom surface corners and has a rectangular planar shape. At this time, projection heights of the first pins 2 are set to be equivalent to the thickness of the heat sink 4 and side walls of the heat sink 4 are pressed against the first pins 2 to thereby position the heat sink 4. The second pins 3 projecting from the bottom surface of the cavity 5 are disposed at the step of the positioned heat sink 4.

Next, as shown in FIG. 4, a semiconductor chip 6 and a lead frame 7 are provided on the positioned heat sink 4. A metal mold 8 is disposed on the metal mold 1 so as to cover these components. The first pins 2 are then lowered to the bottom surface of the cavity 5 (step S2).

Next, as shown in FIG. 5, mold resin 10 is injected into the cavity 5 via a runner 9 provided between the metal molds 1 and 8 and the heat sink 4 is sealed with the mold resin 10 with the second pins 3 being left projecting (step S3). At this time, the heat sink 4 is fixed by the second pins 3 to prevent positional displacement. After sealing with resin is completed, the second pins 3 are lowered to the bottom surface of the cavity 5 (step S4).

As described so far, according to the present embodiment, resin sealing is performed by lowering the first pins 2 after positioning the heat sink 4 using the first pins 2. This allows the first pins 2 to project up to a sufficient height with respect to the thick heat sink 4 with a step, making it possible to position the heat sink 4 with a step. Since this is positioning with the movable pins, the heat sink 4 having a rectangular planar shape can be used. Since the heat sink 4 having a rectangular planar shape is easy to process, it can be produced at low cost. Furthermore, the heat sink 4 is sealed with the mold resin 10 with the second pins 3 disposed at the step being left projecting. It is thereby possible to prevent positional displacement of the heat sink 4 at the time of injection of the mold resin 10. In this way, the present embodiment makes it possible to position the heat sink 4 with a step in bottom surface corners and having a rectangular planar shape with the mold resin 10.

Second Embodiment

Figure 6:
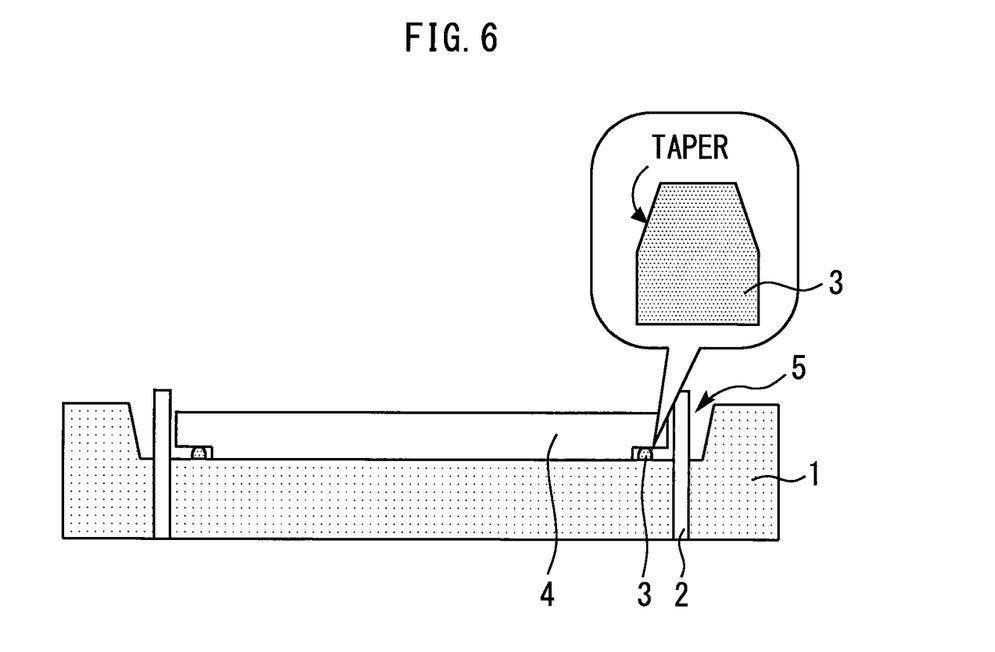
FIG. 6 is a cross-sectional view illustrating a method for manufacturing a semiconductor device according to a second embodiment of the present invention.

FIG. 6 is a cross-sectional view illustrating a method for manufacturing a semiconductor device according to a second embodiment of the present invention. In the present embodiment, the second pins 3 are fixing pins. This reduces the number of movable pins and thereby lowers mold production cost. This also reduces the frequency of cleaning of resin burr on a periphery of movable pins and thereby lowers maintenance cost.

The second pins 3 may have a columnar shape, but the distal ends of the second pins 3 are preferably tapered. In this way, even when the bottom surface of the heat sink 4 rides on the second pins 3, it slides down along the taper and returns to the bottom surface of the cavity 5. In other respects, the construction and effects are the same as those of the first embodiment.

Third Embodiment

Figure 7:
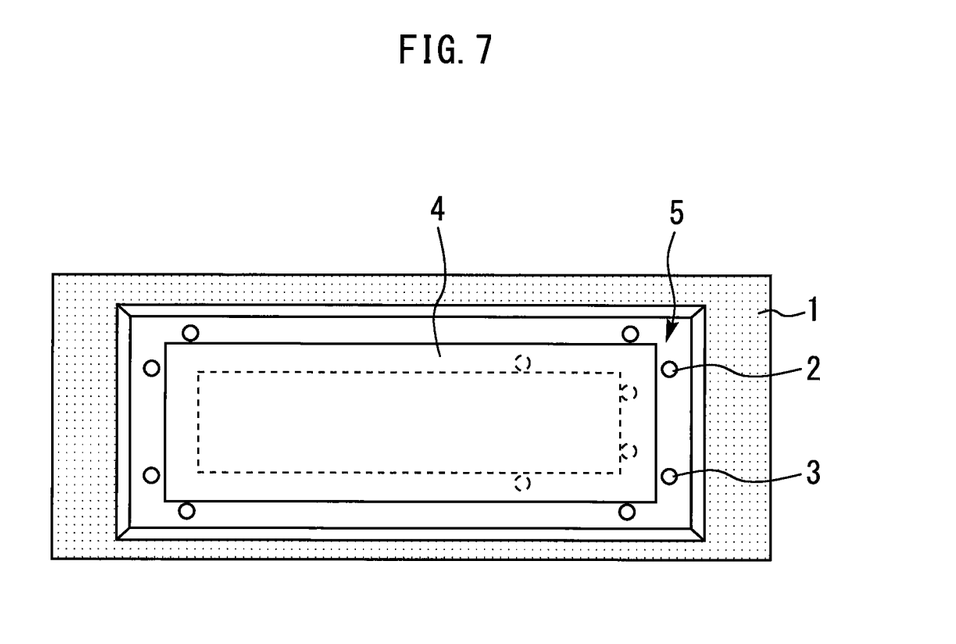
FIG. 7 is a plan view illustrating a method for manufacturing a semiconductor device according to a third embodiment of the present invention.
Figure 8:
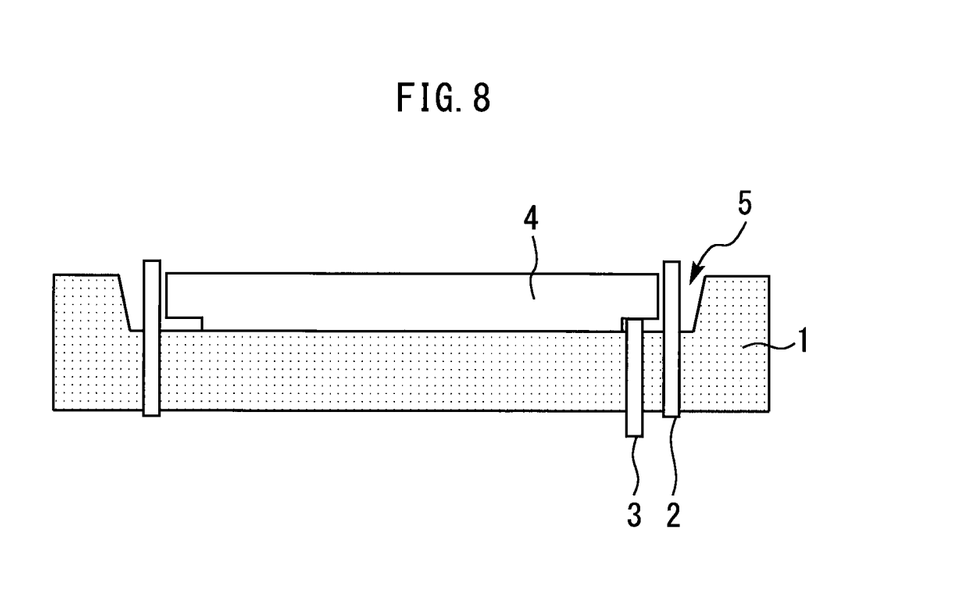
FIG. 8 is a cross-sectional view illustrating the method for manufacturing a semiconductor device according to the third embodiment of the present invention.
Figure 9:
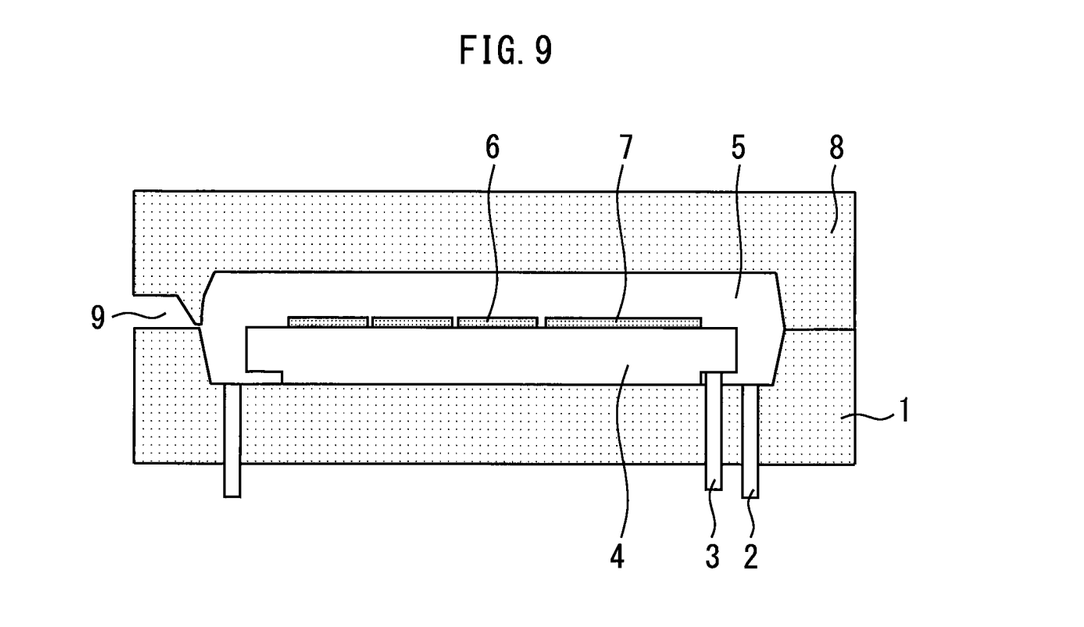
FIG. 9 is a cross-sectional view illustrating the method for manufacturing a semiconductor device according to the third embodiment of the present invention.
Figure 10:
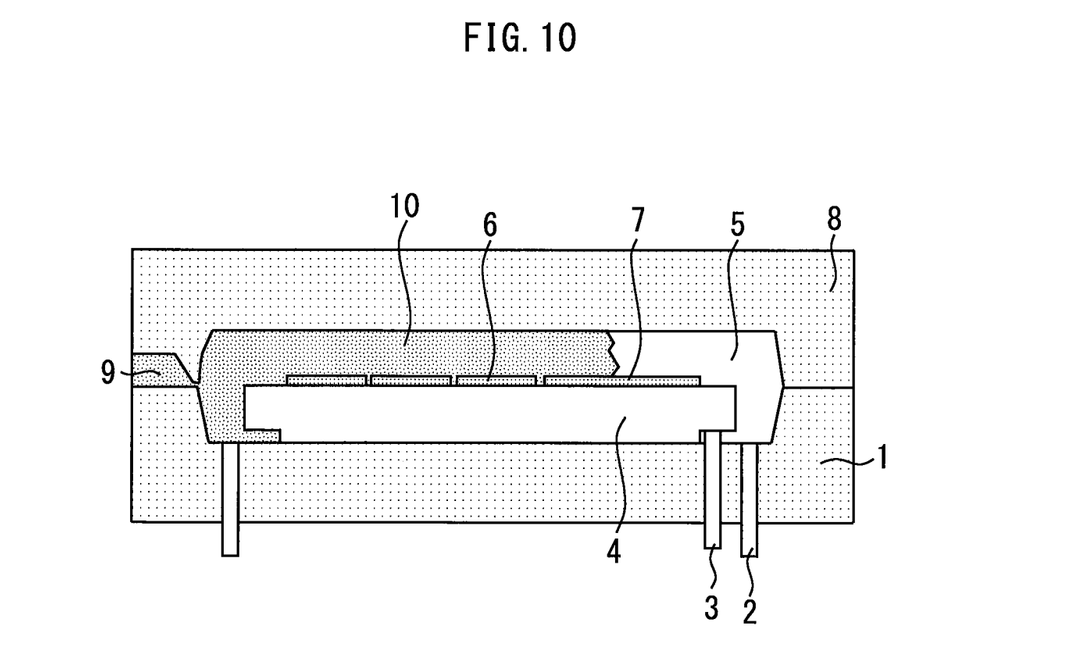
FIG. 10 is a cross-sectional view illustrating the method for manufacturing a semiconductor device according to the third embodiment of the present invention.

FIG. 7 is a plan view illustrating a method for manufacturing a semiconductor device according to a third embodiment of the present invention. FIG. 8 to FIG. 10 are cross-sectional views illustrating the method for manufacturing a semiconductor device according to the third embodiment of the present invention. These FIG. 7 to FIG. 10 correspond to FIG. 2 to FIG. 5 in the first embodiment respectively.

According to the present embodiment, the second pin 3 is not provided on one of the four sides of the heat sink 4 having a rectangular planar shape where the runner 9 which is an injection port of the mold resin 10 to the cavity 5 is provided. This reduces the number of movable pins and thereby reduces mold production cost. This also reduces the frequency of cleaning of resin burr on a periphery of movable pins and thereby lowers maintenance cost. However, the second pins 3 are disposed along the three other sides of the heat sink 4 to prevent positional displacement caused by rotation of the heat sink 4. In other respects, the construction and effects are the same as those of the first embodiment.

Fourth Embodiment

Figure 11:
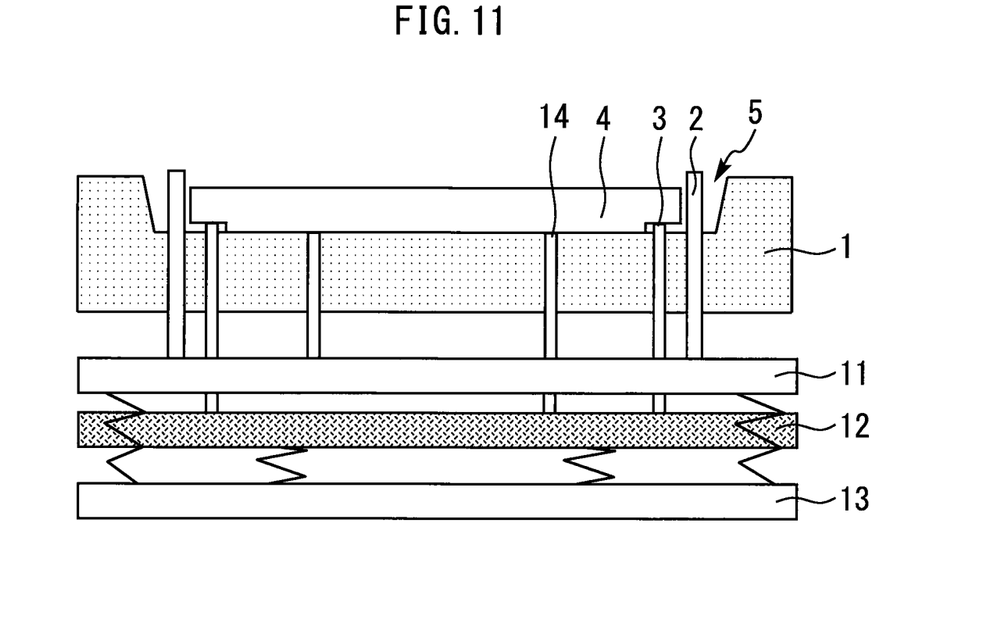
FIG. 11 is a cross-sectional view illustrating a method for manufacturing a semiconductor device according to a fourth embodiment of the present invention.

FIG. 11 is a cross-sectional view illustrating a method for manufacturing a semiconductor device according to a fourth embodiment of the present invention. A movable pin plate 11 and an ejector pin plate 12 are attached to a stopper plate 13 and are individually movable with respect to the stopper plate 13. First pins 2 are fixed to the movable pin plate 11. Ejector pins 14 are fixed to the ejector pin plate 12. The heat sink 4 sealed with the mold resin 10 is extracted by causing the ejector pins 14 to project from the bottom surface of the cavity 5.

The second pins 3 are fixed to the ejector pin plate 12 together with the ejector pins 14 and work in conjunction with the operation of the ejector pins 14. In this way, the second pins 3 themselves function as ejector pins. It is not necessary to newly add a plate to make the second pins 3 movable, and the present embodiment can be implemented with small-scale modifications. Note that the first pins 2 may be fixed to the ejector pin plate 12 and the second pins 3 may be fixed to the movable pin plate 11. In other respects, the construction and effects are the same as those of the first embodiment.

Fifth Embodiment

Figure 12:
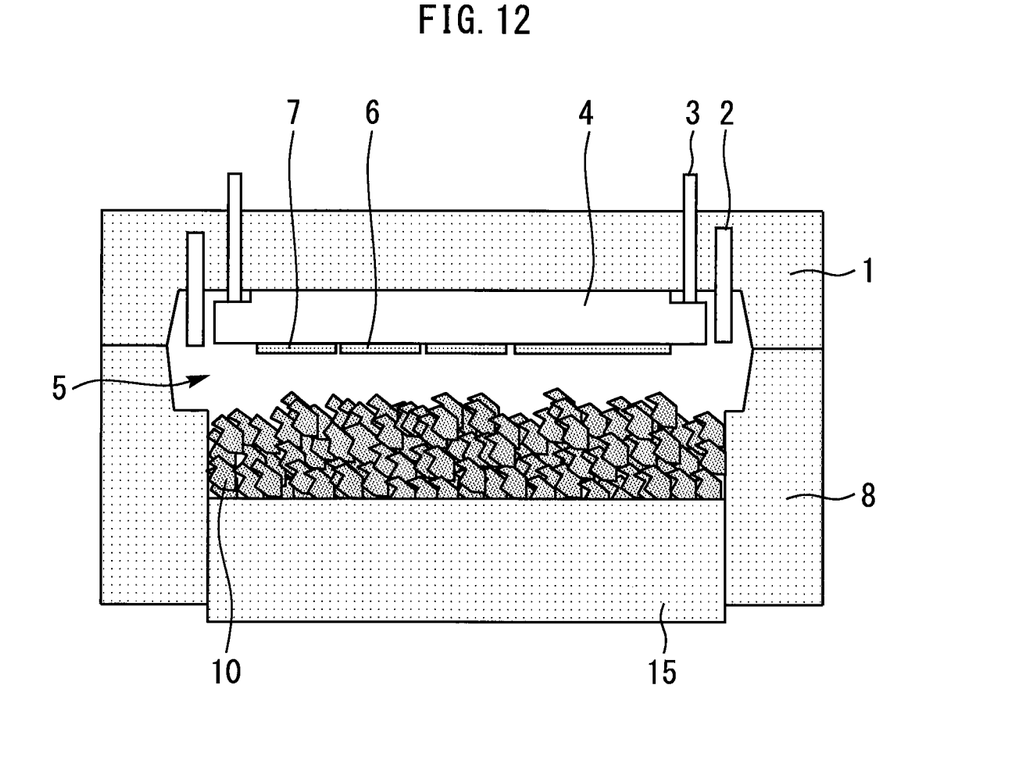
FIG. 12 is a cross-sectional view illustrating a method for manufacturing a semiconductor device according to a fifth embodiment of the present invention.

FIG. 12 is a cross-sectional view illustrating a method for manufacturing a semiconductor device according to a fifth embodiment of the present invention. According to the present embodiment, the heat sink 4 is sealed through a compression mold process. More specifically, the heat sink 4 is positioned on the cavity bottom surface of the upper metal mold 1 first as in the case of the first to fourth embodiments. Next, granular mold resin 10 is melted in the lower metal mold 8 and pushed up by a movable cavity part 15 to thereby seal the heat sink 4 with the mold resin 10. Such a compression mold process can also achieve effects similar to those of the first to fourth embodiments.

The semiconductor chip 6 is a MOSFET, a SBD, an IGBT, a PN diode, or the like. The semiconductor chip 6 is not limited to a chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

REFERENCE SIGNS LIST 1, 8 metal mold; 2 first pin; 3 second pin; 4 heat sink; 5 cavity; 10 mold resin; 12 ejector pin plate; 14 ejector pin

The invention claimed is:

1. A method for manufacturing a semiconductor device comprising:
    disposing a heat sink having a step in a bottom surface corner and a rectangular planar shape in an interior of a cavity of a metal mold and causing a first pin to project from a bottom surface of the cavity to position the heat sink;
    disposing a second pin projecting from the bottom surface of the cavity at the step of the positioned heat sink; and
    after the heat sink is positioned, lowering the first pin to the bottom surface of the cavity and sealing the heat sink with a mold resin with the second pin being left projecting.

2. The method for manufacturing a semiconductor device according to claim 1, wherein
    the second pin is a fixing pin.

3. The method for manufacturing a semiconductor device according to claim 2, wherein
    a distal end of the second pin is tapered.

4. The method for manufacturing a semiconductor device according to claim 1, wherein
    the second pin is not provided on one of four sides of the rectangular planar shape of the heat sink where an injection port of the mold resin to the cavity is provided.

5. The method for manufacturing a semiconductor device according to claim 4, wherein
    the second pin is disposed to prevent positional displacement caused by rotation of the heat sink.

6. The method for manufacturing a semiconductor device according to claim 1, further comprising
    causing an ejector pin to project from the bottom surface of the cavity to extract the heat sink sealed with the mold resin, wherein
    the first pin or the second pin is fixed to an ejector pin plate together with the ejector pin and works in conjunction with an operation of the ejector pin.

7. The method for manufacturing a semiconductor device according to claim 1, wherein
    the heat sink is sealed through a compression mold process.

8. The method for manufacturing a semiconductor device according to claim 2, wherein
    the heat sink is sealed through a compression mold process.

9. The method for manufacturing a semiconductor device according to claim 3, wherein
    the heat sink is sealed through a compression mold process.

10. The method for manufacturing a semiconductor device according to claim 4, wherein
    the heat sink is sealed through a compression mold process.

11. The method for manufacturing a semiconductor device according to claim 5, wherein
    the heat sink is sealed through a compression mold process.

12. The method for manufacturing a semiconductor device according to claim 6, wherein
    the heat sink is sealed through a compression mold process.

13. The method for manufacturing a semiconductor device according to claim 1, wherein
    the first pin is configured to contact a side surface of the heat sink above the step, and
    the second pin configured to contact a side surface of the step.

14. The method for manufacturing a semiconductor device according to claim 1, wherein
    the step defines a region that is removed from the rectangular planar shape,
    the first pin is positioned to protrude into the cavity at a position exterior to the rectangular planar shape, and
    the second pin is positioned to protrude into the region defined by the step.

* * * * *